United States Patent
Wilhelm et al.

(10) Patent No.: US 9,739,862 B2
(45) Date of Patent: Aug. 22, 2017

(54) DNP APPARATUS

(71) Applicant: BRUKER BIOSPIN AG, Faellanden (CH)

(72) Inventors: Dirk Wilhelm, Maur (CH); Joost A. B. Lohman, Kenilworth (GB); Joerg Hinderer, Waldshut-Tiengen (DE); Hannes Grubinger, Zurich (CH)

(73) Assignee: Bruker BioSpin AG, Faellanden (CH)

( * ) Notice: Subject to any disclaimer, the term of this patent is extended or adjusted under 35 U.S.C. 154(b) by 516 days.

(21) Appl. No.: 14/489,502

(22) Filed: Sep. 18, 2014

(65) Prior Publication Data

US 2015/0084632 A1 Mar. 26, 2015

(30) Foreign Application Priority Data

Sep. 26, 2013 (DE) ......................... 10 2013 219 453

(51) Int. Cl.
*G01V 3/00* (2006.01)
*G01R 33/56* (2006.01)
*G01R 33/28* (2006.01)

(52) U.S. Cl.
CPC ......... *G01R 33/5605* (2013.01); *G01R 33/28* (2013.01); *G01R 33/282* (2013.01)

(58) Field of Classification Search
CPC ... G01R 33/5605; G01R 33/28; G01R 33/282

(Continued)

(56) References Cited

U.S. PATENT DOCUMENTS 3,643,176 A 2/1972 Gregory
7,372,274 B2 * 5/2008 Ardenkjaer-Larsen ... G01R 33/282
 324/307

(Continued)

FOREIGN PATENT DOCUMENTS

EP 1 643 261 4/2006
WO WO 02/37132 5/2002

(Continued)

OTHER PUBLICATIONS

Ardenkjaer-Larsen, Jan H. et al., "Increase in signal-to-noise ratio of >10,000 times in liquid-state NMR", PNAS, Sep. 2, 2003, vol. 100, No. 18, 10158-10163.

(Continued)

*Primary Examiner* — Susan Lee
(74) *Attorney, Agent, or Firm* — Paul Vincent

(57) ABSTRACT

A DNP apparatus includes a cryostat (7) having an opening (8) and a loading path for a sample (1), the loading path extending from the opening to a sample receptacle (29), with a cryomagnet and a microwave source (2) as well as a configuration for supplying microwave radiation from the microwave source to the sample, which comprises a microwave path extending directly to the sample. The microwave path extends spatially separately from the loading path and the configuration for supplying microwave radiation has at least one microwave feed-through passing through one or more walls of the cryostat. The microwave path is incident on the sample from a direction opposite to the loading path or from a sideward direction at right angles to or at an inclination with respect to the axis of the loading path. This leads to simple and efficient polarization of the electron spins in the sample.

15 Claims, 13 Drawing Sheets

(58) Field of Classification Search
USPC .......................................................... 324/318
See application file for complete search history.

(56) References Cited

U.S. PATENT DOCUMENTS

| | | | | |
|---|---|---|---|---|
| 7,631,507 | B2* | 12/2009 | Stautner | G01R 33/282 324/307 |
| 7,646,200 | B2* | 1/2010 | Slade | G01R 33/282 324/318 |
| 9,279,868 | B2* | 3/2016 | Lohman | G01R 33/282 |
| 2004/0049108 | A1 | 3/2004 | Ardenkjaer | |
| 2004/0257082 | A1 | 12/2004 | Wakuda | |
| 2006/0192559 | A1* | 8/2006 | Ardenkjaer-Larsen | G01R 33/307 324/321 |
| 2008/0100293 | A1* | 5/2008 | Lucas | G01R 33/282 324/307 |
| 2009/0085562 | A1 | 4/2009 | Strange | |
| 2010/0171495 | A1 | 7/2010 | Bovier | |
| 2013/0274111 | A1* | 10/2013 | Jannin | G01R 33/282 324/307 |
| 2014/0091792 | A1* | 4/2014 | Jannin | G01R 33/282 324/309 |

FOREIGN PATENT DOCUMENTS

| | | |
|---|---|---|
| WO | WO 2006/077361 | 7/2006 |
| WO | WO 2006/106285 | 10/2006 |
| WO | WO 2008/121458 | 10/2008 |
| WO | WO 2011/106524 | 9/2011 |

OTHER PUBLICATIONS

Comment A. et al., "Design and Performance of a DNP Prepolarizer Coupled to a Rodent MRI Scanner", Concepts in Magnetic Resonance Part B (Magnetic Resonance Engineering), vol. 31B(4) 255-269 (2007).

Batel M. et al., "A multi-sample 94 GHz dissolution dynamic-nuclear-polarization system", J. Magn. Reson (2011). doi:10.1016/j.jmr.2011.11.002.

Leggett, James et al., "A dedicated spectrometer for dissolution DNP NMR spectroscopy", Phys. Chem. Chem. Phys., 2010, 12, 5883-5892.

Van Der Linden, Peter J.E.M. et al.. "Miniature pulsed magnet system for synchroton x-ray measurments", Review of Scientific Instruments 79, 075104 (2008).

* cited by examiner

DNP APPARATUS

This application claims Paris convention priority from DE 10 2013 219 453.6 filed Sep. 26, 2014, the entire disclosure of which is hereby incorporated by reference.

BACKGROUND OF THE INVENTION

The invention concerns a DNP (dynamic nuclear polarization) apparatus comprising at least one cryostat having an opening and a loading path for loading the cryostat with a sample, wherein the loading path extends in a straight line from the opening to a sample receptacle at the location of the sample in the cryostat, wherein a magnet coil is arranged in the cryostat for generating a homogeneous magnetic field at the location of the sample during the measurement, wherein a microwave source is provided for generating microwave radiation, and wherein a configuration for supplying microwave radiation from the microwave source to the location of the sample is arranged in the cryostat, the configuration comprising a microwave path extending in a straight line directly from the opening to the location of the sample in the cryostat.

A configuration of this type is disclosed e.g. in WO 08/121458 A1 (reference [6]).

Nuclear magnetic resonance (NMR) spectroscopy is a method that is commercially widely used for characterizing the chemical composition of substances. The magnetic resonance imaging (MRI) method is based on the same basic physical principles as NMR spectroscopy. Both methods have the disadvantage that they are substantially insensitive since, even in strong magnetic fields, polarization of the atomic nuclei is very weak. For this reason, an increase in the signal-to-noise-ratio (SNR) is one of the most important aims in the development of NMR and MRI devices. The SNR can be increased either by reducing the noise portion or by increasing the signal level. The noise was reduced with great success in recent years by using cooled NMR and also MRI coils.

The desired increase in the NMR signal can be realized e.g. by using stronger NMR magnets which entails, however, considerable additional cost and in most cases also increased space requirements for the apparatus.

As an alternative, so-called "dynamic nuclear polarization" (DNP) methods may be used.

There are different experimental methods in the field of nuclear magnetic resonance spectroscopy, which significantly increase the nuclear polarization and thereby also increase the detection sensitivity of the experiment. One of these methods is dynamic nuclear polarization (DNP). This technology requires simultaneous irradiation of a magnetic microwave field at a frequency which is higher by a factor of 660 compared to the nuclear Larmor frequency of the 1H nuclei.

Dynamic nuclear polarization requires the presence of polarization agents in the sample, e.g. free radicals with unpaired electron spins. Moreover, one utilizes the fact that electrons achieve high polarization at low temperatures in a strong magnetic field. Transfer of the electron polarization to the atomic nuclei of the sample is effected through irradiation of a microwave field of a suitable frequency due to interactions. When the nuclear spins in the sample have reached a sufficiently high level of polarization, the sample can be quickly heated to room temperature by means of a dissolution liquid, e.g. hot water. This process must be performed within a sufficiently short time since the nuclear spins quickly lose their polarization at higher temperatures.

The methods of polarization and subsequent heating and dissolving of the sample are disclosed e.g. in references [1], [2], [6] and [7].

In reference [1], the magnet coil is cooled in a magnet cryostat to temperatures in the range between 4 K and 4.5 K. The sample is directly introduced into the same magnet cryostat and cooled to 1 K to 5 K in a separate helium region within this cryostat. The electron spins are then excited by means of suitable microwave radiation. The frequency of the microwave radiation depends on the strength of the magnetic field in which the sample is located. It is in a range between 50 GHz and 1000 GHz.

The microwaves are introduced into the magnet cryostat through the same opening as the sample by means of a wave guide. The sample is introduced with a sample holder from the top into the magnet cryostat. Sample lines are moreover introduced from the top into the cryostat for dissolving the sample. Since the space in the cryostat is relatively small, the microwaves cannot be guided in a straight way to the sample but must be deflected by means of mirrors for irradiation. The microwaves are thereby attenuated which results in power losses.

Reference [3] discloses a DNP method in which, in contrast to reference [1], a sample cryostat is inserted into the magnet cryostat in the form of an insert. The sample is introduced into the sample cryostat and cooled to temperatures in the range between 1 K and 5 K. The cold sample is then also irradiated with high-frequency microwaves in order to excite the electron spins. In this configuration, the sample is initially irradiated using a microwave guide that is inserted in a straight line from the top. When the electron spins have reached an adequate level of polarization, the microwave guide is removed in an upward direction from the sample cryostat and a device for dissolving the sample is inserted from the top and moved to the sample. This configuration is advantageous in that the microwave guide can be straight, but is disadvantageous in that changing between the microwave guide and the sample dissolution device is complex. This change is very difficult to automate.

In a further development of reference [3], which is described in reference [4], a plurality of samples are simultaneously cooled in a sample cryostat. The samples are located in a sample changer which is designed as a rotary plate. In this device, the samples can be polarized at a circumferential position by means of the microwaves and the sample can be dissolved at a different circumferential position. This configuration consequently enables straight guidance of the microwaves. This configuration is disadvantageous in that the changing device is located in the very cold area of the sample cryostat. Mechanical movement at temperatures below 5 K is very complex to enact and is prone to malfunction.

In reference [6], the microwave guide is guided in a straight way either within the loading path from the top to the location of the sample or in a further embodiment described in reference [6], the microwave guide surrounds the straight loading path. For this reason, the microwave guide passes in a straight way from the top to the sample. Coupling the microwaves into the exterior microwave guide is a complex and difficult process which is accompanied by microwave losses. When, however, the microwaves are guided within the loading path, the microwave guide must be removed from the loading path each time a sample is loaded. This process, which is also described in reference [6], is disadvantageous in that it is difficult to automate.

Reference [7] utilizes a magnet with two homogeneous magnetic field regions. In the first region, microwave irradiation is performed and in the second region dissolution and NMR measurement are performed. In reference [7], the loading path is combined with a movable microwave guide. The sample is thereby filled into a small sample holder and the sample holder is directly connected to the long movable microwave guide. The sample located in the sample holder is irradiated with the microwave in the first homogeneous magnetic field region. When polarization has reached an adequate level, the sample is transferred to the second homogeneous magnetic field region.

The conventional configurations have in common that the microwaves are introduced in each case through the same cryostat opening as the samples.

The configurations described in references [1], [3] and [7] are primarily designed for manual DNP operation. In reference [1] the sample holder and the wave guide are horizontally offset with respect to each other. This is, however, only possible by deflecting the wave guide e.g. using mirrors. This deflection attenuates the microwaves and thereby reduces the efficiency of the system.

In references [3] and [6], the microwaves are inserted in a straight line from the top which consequently causes little loss. However, this is disadvantageous in that the wave guide must be removed prior to the dissolution step. It is then replaced by the dissolution device consisting of a solvent supply line and an outlet line. This procedure is disadvantageous in that it is difficult to automate.

In reference [7], the dissolution device is inserted from below, however, the microwave guidance must be removed each time a sample is loaded. This is very complex and automation is not possible. Furthermore, this construction requires a special cryostat design in which the sample and the microwave are introduced from one side and the dissolution device is introduced from the other side. In order to realize this, the cryostat has two openings which renders construction complicated and complex.

The configuration of reference [4] is disadvantageous in that it has a mechanical sample changer that must be operated at a temperature of less than 5 K. This mechanism is very complex and prone to malfunction.

In contrast thereto, it is the underlying purpose of the present invention to present a DNP apparatus of the above defined type which achieves simple and efficient polarization of the electron spins in the sample. The microwaves should thereby be guided in such a fashion that the losses on the way to the sample are minimized, thereby obtaining high efficiency. Moreover, the microwave guide should be permanently installed such that the microwaves do not need to be removed for changing the sample or during the dissolution step. The invention should moreover also enable highly reliable automation. Complicated mechanical devices at very low temperatures of less than 5 K should be absolutely prevented in this case. The space within the loading path in the cryostat shall be optimally utilized for loading and dissolving the sample.

SUMMARY OF THE INVENTION

This object is achieved in a surprisingly simple fashion and with readily available technical means using a DNP apparatus comprising the above-mentioned features, which is characterized in that the microwave path extends spatially separately from the loading path for loading the cryostat with a sample, the configuration for supplying microwave radiation comprises at least one microwave feed-through passing through one or more walls of the cryostat and the microwave path is incident on the location of the sample from a direction opposite to the loading path or at right angles or at an inclination from the side with respect to the axis of the loading path.

The microwaves are thereby guided from the outside through the cryostat by means of suitable feed-throughs and, in contrast to prior art, not through the opening for loading the sample. Microwave feed-throughs passing through cryostats are known per se from literature, e.g. from reference [5], however, not in the application for cryostats that are used in DNP systems.

The microwaves can moreover be guided directly to the sample in a very energy-efficient and simple technical fashion by means of the DNP apparatus modified in accordance with the invention.

The spatial separation between microwave guidance and sample introduction has two substantial advantages with regard to the mode of operation of the invention and further advantages in comparison to prior art. Firstly, the microwaves can be guided in a straight way to the sample. Consequently, lossy deflections, e.g. by means of mirrors, are not necessary. This leads to high efficiency of the microwave radiation that is irradiated onto the sample. Secondly, this separation provides more space in the cryostat for introducing the samples and for the dissolution process. This space can be well used for automation of the overall DNP procedure.

In accordance with the present invention, there are substantially three alternatives for the microwave path. It can be incident on the location of the sample from a direction opposite to the loading path or at right angles or at an inclination from the side with respect to the axis of the loading path.

In the first alternative, the sample is introduced e.g. from the top into the cryostat and the microwaves are introduced through the opposite bottom into the cryostat and irradiate the sample from below. It is, however, also possible for the sample to be introduced from below and the microwaves to be introduced from the top into the cryostat. The introduction path and the configuration for irradiation of the microwaves are thereby on the same axis. Since the microwave path is completely independent of the sample introduction path, sample introduction from the top is easy to automate. This offers considerable advantages for use of the DNP system in combination with an additional NMR or MRI system. Automation enables fast, efficient and reproducible performance of the overall measuring sequence.

In the second alternative, the sample is e.g. again introduced from the upper side into the cryostat and the microwaves are irradiated from the side. The introduction path of the sample extends again in a straight line and is formed by the cryostat opening for loading the sample and the receptacle for the samples which is located in a highly magnetic area of the cryostat. With respect to the axis of the loading path, the microwave path is then arranged at right angles with respect to the loading path. This configuration is again advantageous compared to prior art in that it is not necessary to use the same confined opening for microwave irradiation and sample loading.

In the third alternative, the microwave path extends at an inclination, i.e. at an angle with respect to the loading path which is different from 90°. It may be advantageous for the construction of the cryomagnet that the microwave path is arranged in a straight line but at an angle with respect to the loading path which is different from 90°. This configuration is also advantageous compared to prior art in that it is not necessary to use the same confined opening for microwave irradiation and sample loading.

In contrast to the standard DNP apparatus, in an embodiment of the apparatus modified in accordance with the invention which is characterized by a magnet cryostat and a sample cryostat, exchange of the sample cryostat is moreover very simple without having to remove the microwave guidance. The microwave source including microwave guidance can therefore be permanently installed.

In one preferred embodiment of the inventive DNP apparatus, the microwave passage causes attenuation of the microwave radiation by less than 6 dB, preferably less than 2 dB, particularly preferred less than 0.5 dB.

The microwaves are guided through a cryostat wall and are thereby minimally attenuated. Attenuation of the microwave in the microwave passage reduces the microwave energy that is available for irradiation of the sample. This reduction should be minimized for reasons of efficiency. In contrast to prior art, where deflections of the microwave are required, the inventive straight guidance of the microwave minimizes the losses in the passages.

In further preferred embodiments of the invention, the material in the area of the feed-through passing through the cryostat walls comprises polytetrafluoroethylene (PTFE) and/or sapphire and/or aluminum oxide and/or quartz. These feed-through materials have low attenuation values for microwaves in the intended frequency range and are therefore advantageous.

In particularly preferred embodiments of the inventive DNP apparatus, the heat output by the microwave feed-through on the cryostat is less than 200 mW, preferably less than 100 mW, preferentially less than 50 mW. Since attenuation of the microwaves generates heat which, in turn, causes heating of the cryostat, a microwave feed-through is preferred that minimizes loss. The heat input generated by the microwaves must be compensated for by the cooling power introduced into the cryostat. This additional cooling power shall be minimized for reasons of efficiency.

In further advantageous embodiments of the inventive DNP apparatus, the configuration for supplying microwave radiation terminates at a separation d of less than 10 mm, preferably 5 mm, particularly preferred 1 mm from the sample at the sample location in the cryostat. For this reason, the waves are guided to the sample and radiation losses along the transport path are thereby largely prevented. Due to the very low radiation losses, the microwave energy density in the sample is considerably higher than in prior art. The efficiency of the overall system is correspondingly substantially increased.

In further particularly preferred embodiments of the invention, the configuration for supplying microwave radiation comprises a dielectric wave guide. The transmission losses of this wave guide are no longer dependent on the quality of the metallic surfaces and on the materials but on the dielectric properties of the material used. Frequencies in the 100 GHz range are used, which produce similarly low losses. The substantial advantage of this realization variant consists in that the heat input of the wave guide is substantially reduced due to the low thermal conductivity of a dielectric wave guide. Direct guidance of the wave guide through the cryostat is therefore possible which substantially simplifies and facilitates construction.

Further developments of these embodiments are even more advantageous, in which an antenna, e.g. a horn-shaped antenna or a coupler is provided at the end of the dielectric wave guide in order to spatially concentrate the microwaves on the area of the sample. This additionally increases efficiency. Other particularly preferred further developments of these embodiments are characterized in that the dielectric wave guide is formed from a dielectric with a dielectric constant $\in$ with $1 \leq \in \leq 15$, in particular of polytetrafluoroethylene (PTFE) and/or sapphire and/or aluminum oxide and/or quartz.

Embodiments of the inventive DNP apparatus are also particularly preferred, in which the microwave feed-through comprises at least one dielectric lens. The dielectric lenses are thereby used for focusing the microwave energy. The wave guide terminates at a larger separation from the sample in comparison with the above-mentioned embodiments. Dielectric lenses are inserted into the space between the end of the wave guide and the sample and are dimensioned such that the microwave energy is maximally focused on the sample, thereby substantially increasing the efficiency. An antenna or a coupler is advantageously provided at the end of the wave guide. This reduces the losses at the transition and further increases the efficiency.

Advantageous further developments of this embodiment are characterized in that the dielectric lens has an insertion loss of 5 dB, preferably of 2 dB, in particular of 1 dB, particularly preferred of 0.5 dB. The insertion loss of the dielectric lens is directly associated with the microwave losses in this area. These losses are again directly converted into thermal energy that loads the cryostat. For this reason, a minimum insertion loss is advantageous.

The dielectric lens is generally formed from a dielectric with a dielectricity constant $\in$ with $1 \leq \in \leq 15$, in particular polytetrafluoroethylene (PTFE) and/or sapphire and/or aluminum oxide and/or quartz. The dielectric lenses focus microwaves in the area of the cryostat passage. For this reason, only a small part of the microwave energy is laterally radiated during passage through the cryostat. This is important since the laterally radiated microwave energy cannot be used for irradiation of the sample and this energy also causes heating of the cryostat and must therefore be compensated for by a superior cooling performance.

In a furthermore even more preferred variant, the lens system is additionally shielded. Shielding is realized by a metallic structure that is similar to a wave guide. Since the lenses must be accommodated therein, it might be necessary to select a large cross-section in comparison with a wave guide. Shielding has the additional advantage that edge fields can also be guided to the sample, which increases efficiency. Guidance of a substantially larger part of the microwave energy also reduces the heat input into the cryostat, which results in increased temperature stability and reduced cooling power.

In a further preferred embodiment, an antenna is mounted at the end of the wave guide or of the dielectric wave guide in order to optimize irradiation. This reduces the matching losses and improves concentration of the microwave power on the sample. The efficiency can be substantially increased through improved bundling of the energy. Capacitive or inductive couplers may also be used instead of the antenna.

One particularly preferred class of embodiments of the inventive DNP apparatus is characterized in that a configuration is provided for supplying a solvent liquid which enables dissolution of the sample and generation of a hyperpolarized sample liquid.

The polarized sample is quickly heated with a solvent liquid, e.g. hot water, to temperatures in the range between 5° C. to 70° C. The sample may be dissolved directly in the strong magnetic field in which the sample was polarized by the microwaves. The warm, liquid sample has a very high nuclear spin polarization after dissolution.

In particularly preferred further developments of this class of embodiments, the solvent liquid is supplied to the sample from the top and the microwave radiation is supplied to the sample from below. The solvent liquid is thereby guided in a direction opposite to the microwaves, i.e. from the top, to the sample. The sample has previously been irradiated from below. The reverse configuration, in which the microwaves are guided from the top to the sample and the solvent liquid is guided from below to the sample, is advantageous. It is important for both configurations for the microwave path to be separate from the loading path of the sample. In this case, the microwave guide can be permanently installed and does not need to be removed each time a sample is loaded.

The present invention also concerns the use of a DNP apparatus of the above described embodiments for generating hyperpolarized liquid for NMR and/or MRI measurements. Towards this end, polarization agents, e.g. free radicals with unpaired electron spins are used. The sample is cooled to a low temperature of less than 5 K in a strong magnetic field. Polarization of the electron spins thereby strongly increases. The sample is then irradiated with microwaves and interactive processes cause polarization transfer to the nuclear spins of the sample. For this reason, polarization of the nuclear spins is considerably increased. In contrast to prior art, guidance of the microwaves causes minimum loss which results in efficient polarization of the sample.

For NMR spectroscopic applications, the irradiated and dissolved sample is directly transported into a probe head that is located in a further NMR system. Spectroscopic NMR measurement is then performed in this probe head. Due to the high polarization of the nuclear spins, this NMR experiment yields an SNR that is 10000 times higher. Nuclei with long relaxation times T1, such as e.g. 13C or 15N, are especially suited for these NMR measurements.

In MRI applications, the irradiated and dissolved sample is collected by a syringe. It is subsequently directly injected into a person or an animal to be investigated. Due to the high polarization of the nuclear spins, this NMR experiment also yields a SNR that is 10000 times higher. Nuclei having a long relaxation time T1, such as e.g. 13C or 15N, are particularly suited for these MRI measurements, since the relaxation time is directly associated with the reduction in nuclear spin polarization. Proton measurements (1H) are also possible but are less suited in the present case due to the short relaxation times of 1H.

Further advantages of the invention can be extracted from the description and the drawing. The features mentioned above and below may be used in accordance with the invention either individually or collectively in arbitrary, given combination. The embodiments shown and described are not to be understood as exhaustive enumeration but have exemplary character for describing the invention.

The invention is illustrated in the drawing and is explained in more detail with reference to embodiments.

DESCRIPTION OF THE PREFERRED EMBODIMENT

The present invention concerns optimization of DNP apparatus for use in NMR and MRI devices.

NMR spectroscopy and magnetic resonance imaging (MRI) methods suffer from the low number of polarized nuclear spins. This nuclear spin polarization can be increased by so-called "dynamic nuclear polarization" (DNP) methods. One of these DNP methods is the dissolution DNP method. A sample that contains a polarization agent and is located in a strong magnetic field is thereby irradiated with microwaves at low temperatures (less than 5 K). Due to interactions, the electron spins are transferred to the nuclear spins of the sample. When the polarization of the nuclear spins has reached an adequate level, the sample is dissolved in a very fast process, the so-called dissolution step, and is simultaneously strongly heated. The now liquid sample has a very high nuclear spin polarization. It can then be measured with NMR or MRI systems. In this fashion, the signal-to-noise ratio can be increased by factors of far more than 10000 compared to conventional methods. For this reason, these dissolution DNP methods are advantageous, in particular, for increasing the contrast in MRI measurements. In order to be able to use this method in the clinical and also in pre-clinical fields, a largely automated procedure is very advantageous.

The sample is brought to its desired temperature in a cryostat. Towards this end, two types of systems are used. The sample is either directly inserted into the magnet cryostat. This device requires only one cryostat. Or a further cryostat that accommodates the sample is provided in the cryomagnet.

In both prior art cases, the wave guide is introduced into the cryostat through the same opening as the sample for transporting the microwaves. This has the considerable disadvantage that the area in which the sample is located is relatively crowded. For this reason, reliable automation of sample polarization with microwave radiation and dissolution is quite difficult with conventional configurations.

The present invention is characterized in that the microwave guide follows a path that is independent of the sample introduction opening. It is guided through the cryostat on a straight path with suitable feed-throughs. Due to the straight guidance, deflections, e.g. in the form of mirrors, can be omitted which results in efficient and low-loss passage of the microwaves. One considerable advantage over prior art is the space gain in the cryostat. For this reason, the inventive configuration realizes automated sample management. The possibility of automation is of considerable advantage for the clinical and pre-clinical use of the method.

Figure 1:
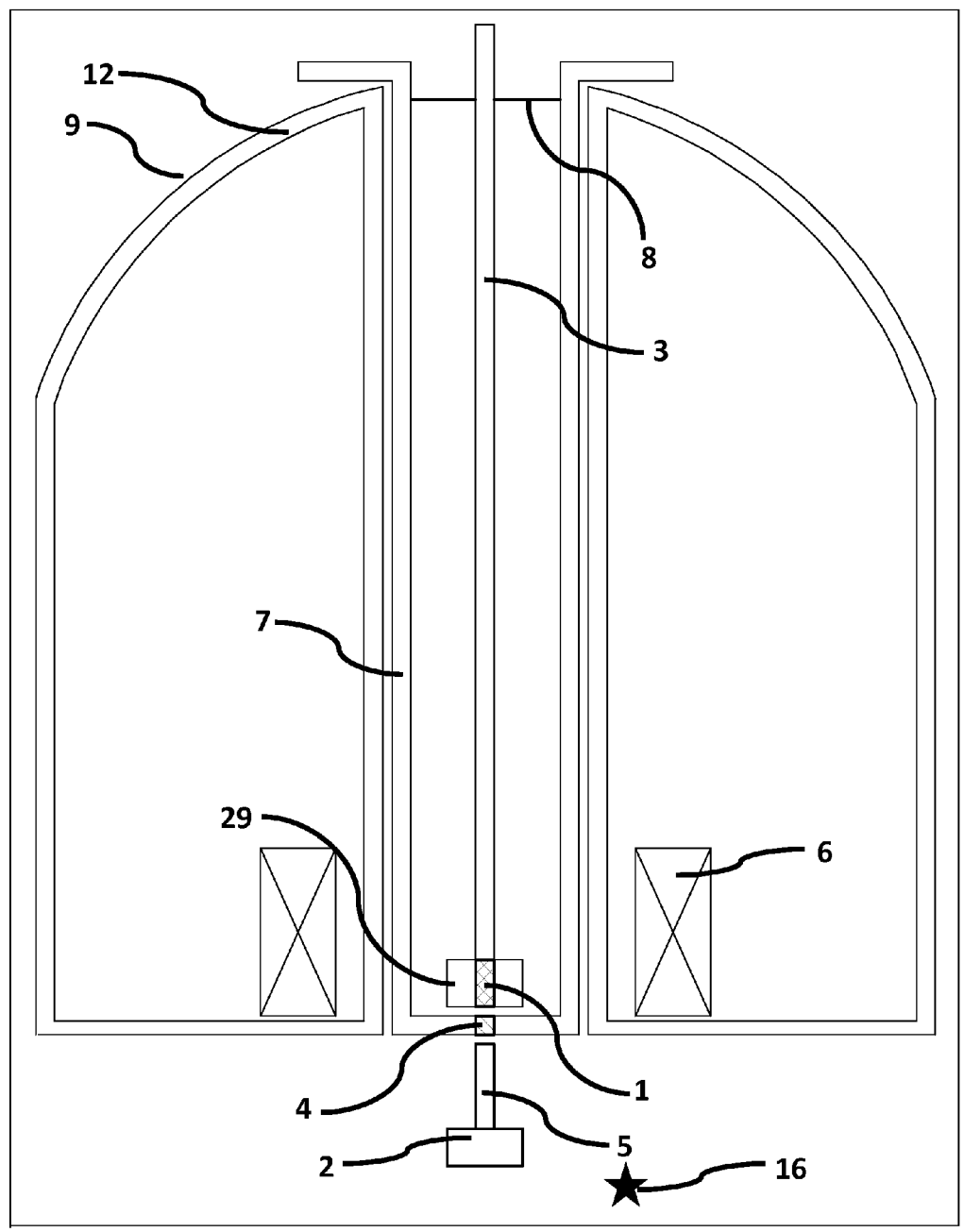
FIG. 1 shows a schematic vertical section of an embodiment of the inventive DNP configuration for guiding the microwaves from below.

FIG. 1 schematically illustrates the inventive configuration for performing DNP experiments. The sample 1 is held by the sample holder 3 and is located in the sample receptacle 29. The sample holder, the sample and the sample receptacles are, in turn, located in the sample cryostat 7 that has an opening 8. This opening is used to introduce the sample holder including the sample.

The sample cryostat is located within the strong cryomagnet 9. The cryomagnet has again a magnet cryostat 12 and a magnet coil 6. The sample 1 is irradiated with microwaves in the frequency range between 50 GHz and 1000 GHz: typical values are 100 GHz. The microwaves are generated in the microwave source 2 and are introduced from below via the wave guide 5. The microwave source 2 is thereby located either directly below the cryomagnet 9 or e.g. on the side of the cryomagnet which requires deflection of the microwave using suitable devices e.g. mirrors. The microwaves exit the wave guide 5, pass the feed-through 4 in the sample cryostat and then enter into the sample receptacle 29 where the sample 1 is located. In contrast to prior art in accordance with reference [1], in the present case, the sample receptacle 29 only receives the sample but need not have structures that are tailored to the microwaves, since the microwaves are irradiated directly from below onto the sample. The microwave passage 4 is designed such that thermal losses and attenuation of the microwave can be kept at a minimum.

Figure 2:
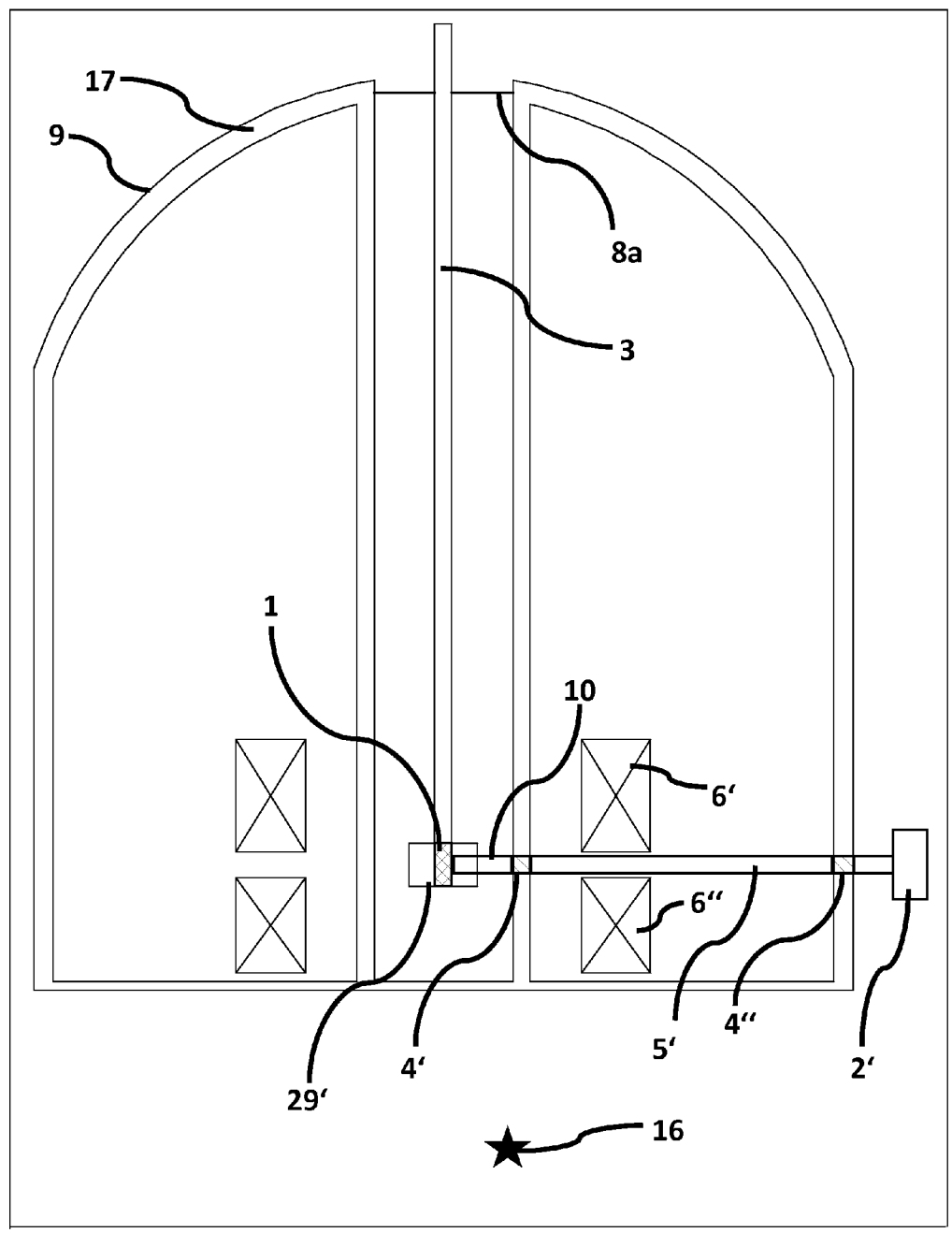
FIG. 2 shows a side view of an embodiment of the inventive DNP configuration for guiding the microwaves.

FIG. 2 shows an inventive configuration, in which the microwaves are guided through the cryostat. This configuration is interesting for so-called split magnets 6', 6'', in which the cryomagnet coils are divided into different areas (see e.g. references [8], [9]). The microwaves are guided through the cryostat 17 by means of two feed-throughs 4' and 4'' and are then guided with the wave guide 10 through the sample receptacle 29' to the sample 1. This structure is more complex than that of FIG. 1 since a further feed-through 4'' is required. It is, however, also possible for the two split magnet coils 6' and 6'' to be completely separated, each being surrounded by separate cryostats. The wave guide 10 can then be introduced into the opening located between the two split magnet coils 6', 6''. In this case, the opening 4'' is not required which considerably simplifies the structure of the microwave feed-through.

Figure 3:
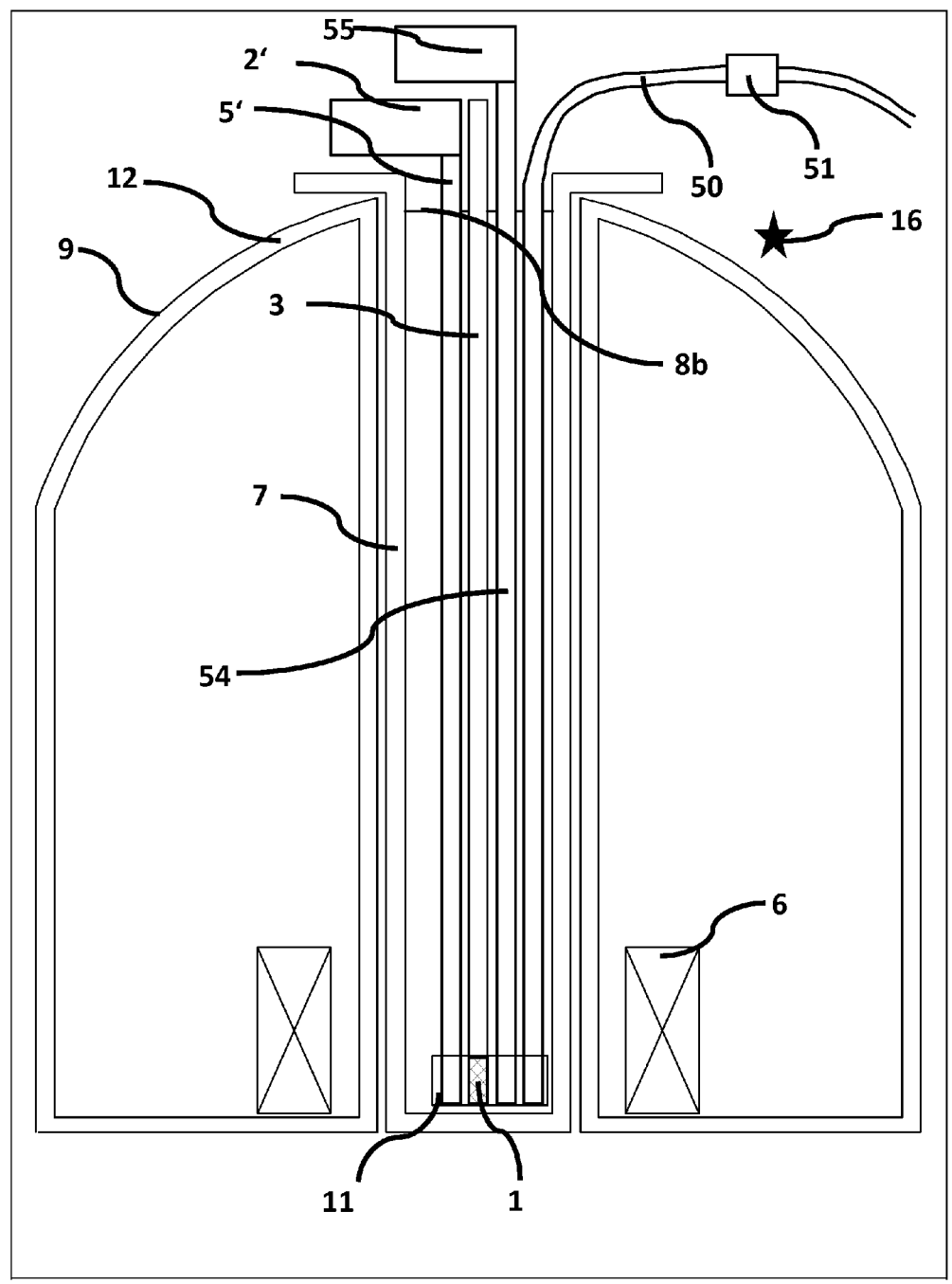
FIG. 3 shows a schematic vertical section of a DNP configuration according to prior art with guidance of the microwaves through the sample opening of the cryostat.

FIG. 3 shows prior art, wherein the microwave is guided from the microwave source 2' via the wave guide 5' through the opening 8b in the sample cryostat to the microwave chamber 11 and finally to the sample 1. The sample cryostat is located in the cryomagnet 9 which again has a cryostat 12 and a magnet coil 6. In this configuration, the two cryostats 12 and 7 are separated. The configuration is designed for dissolution DNP measurements. The sample 1 is thereby initially irradiated with microwave radiation in the range between 50 GHz and 1000 GHz, whereby nuclear spins in the sample are polarized due to interactions. When polarization has reached an adequate level, the sample is quickly heated to room temperature by means of a dissolution liquid (e.g. hot water). Towards this end, the dissolution liquid is introduced from the solvent container 55 via the solvent supply line 54 into the microwave chamber 11. The dissolution liquid dissolves the frozen sample and the dissolved sample then flows through the outlet line 50 and the dissolution control 51 out of the DNP apparatus. It can be collected and be used for NMR or MRI experiments.

Figure 4:
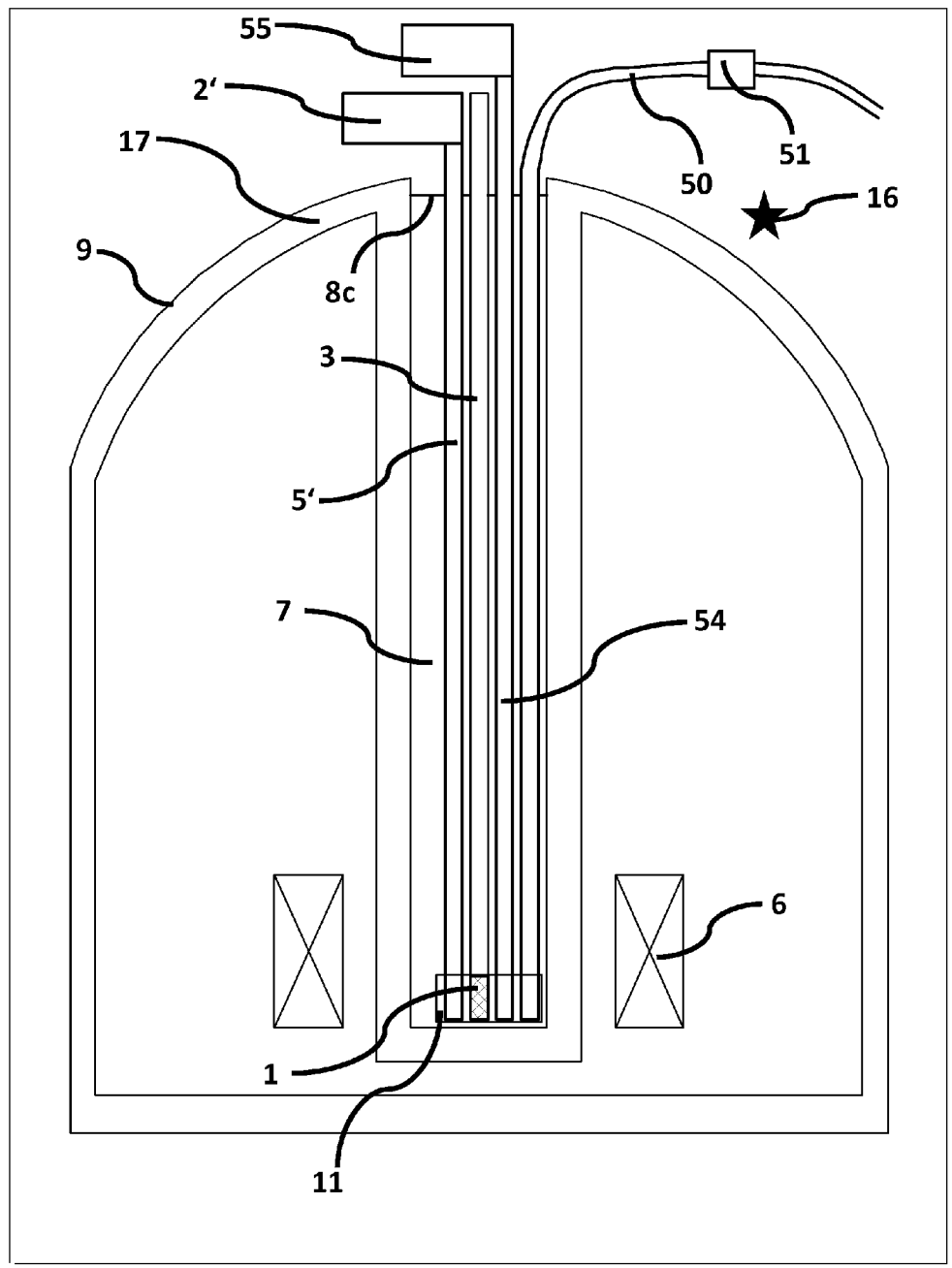
FIG. 4 shows an embodiment of the DNP configuration according to prior art, wherein a common cryostat is used for magnet and sample, which has, however two separate helium regions that are operated at different temperatures.

FIG. 4 shows a DNP configuration according to prior art that is analog to FIG. 1, wherein the magnet cryostat and the sample cryostat are not separate but only one cryostat 17 is used to cool the magnet coil and the sample.

Figure 5:
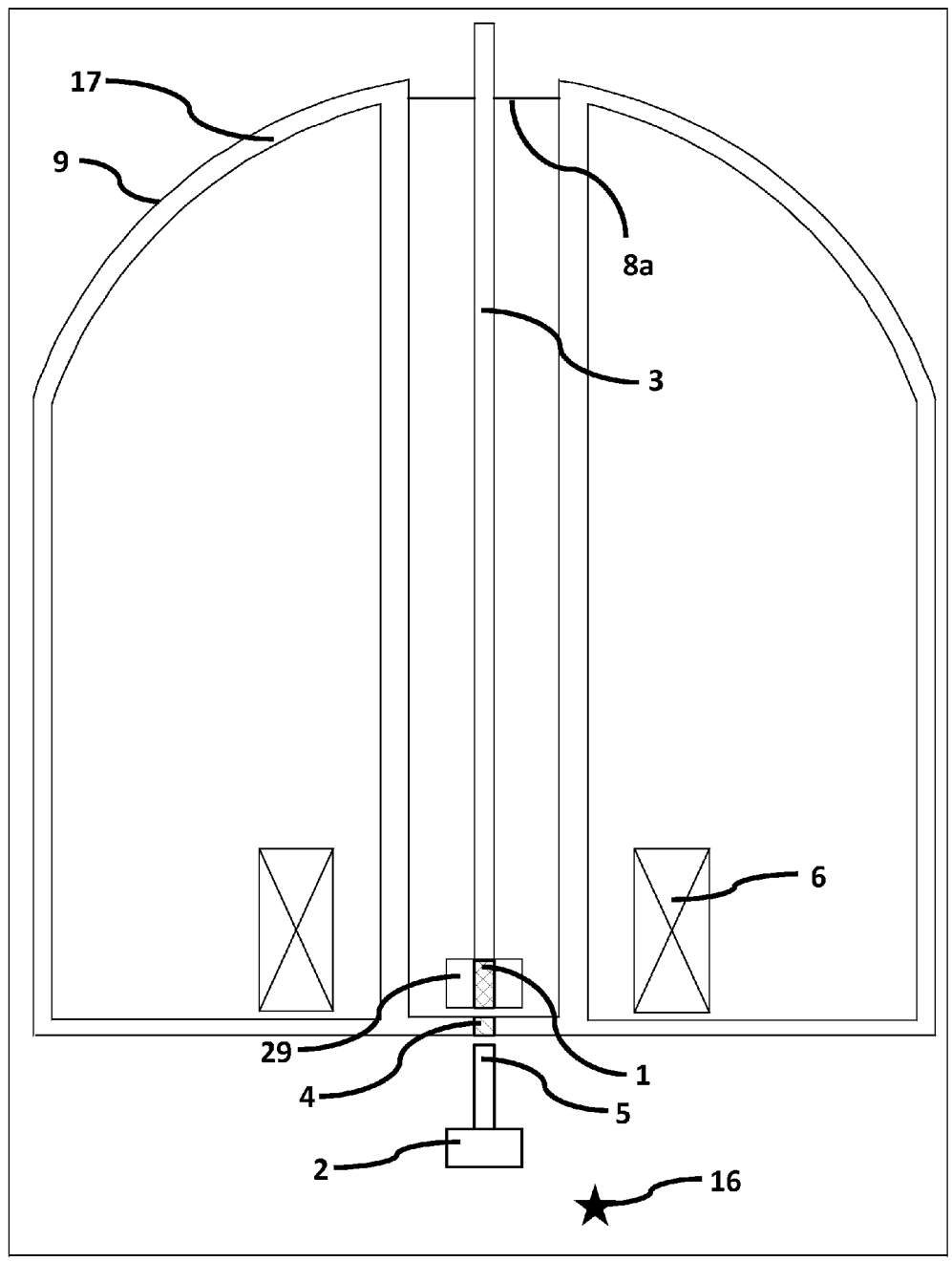
FIG. 5 shows a schematic vertical section of an embodiment of the inventive DNP configuration for guiding the microwaves from below, wherein the sample cryostat and the magnet cryostat are not separate.

FIG. 5 shows the inventive configuration with microwave supply from below like in FIG. 1, wherein in this case only one cryostat 17 is used for cooling the magnet coil and the sample.

Figure 6:
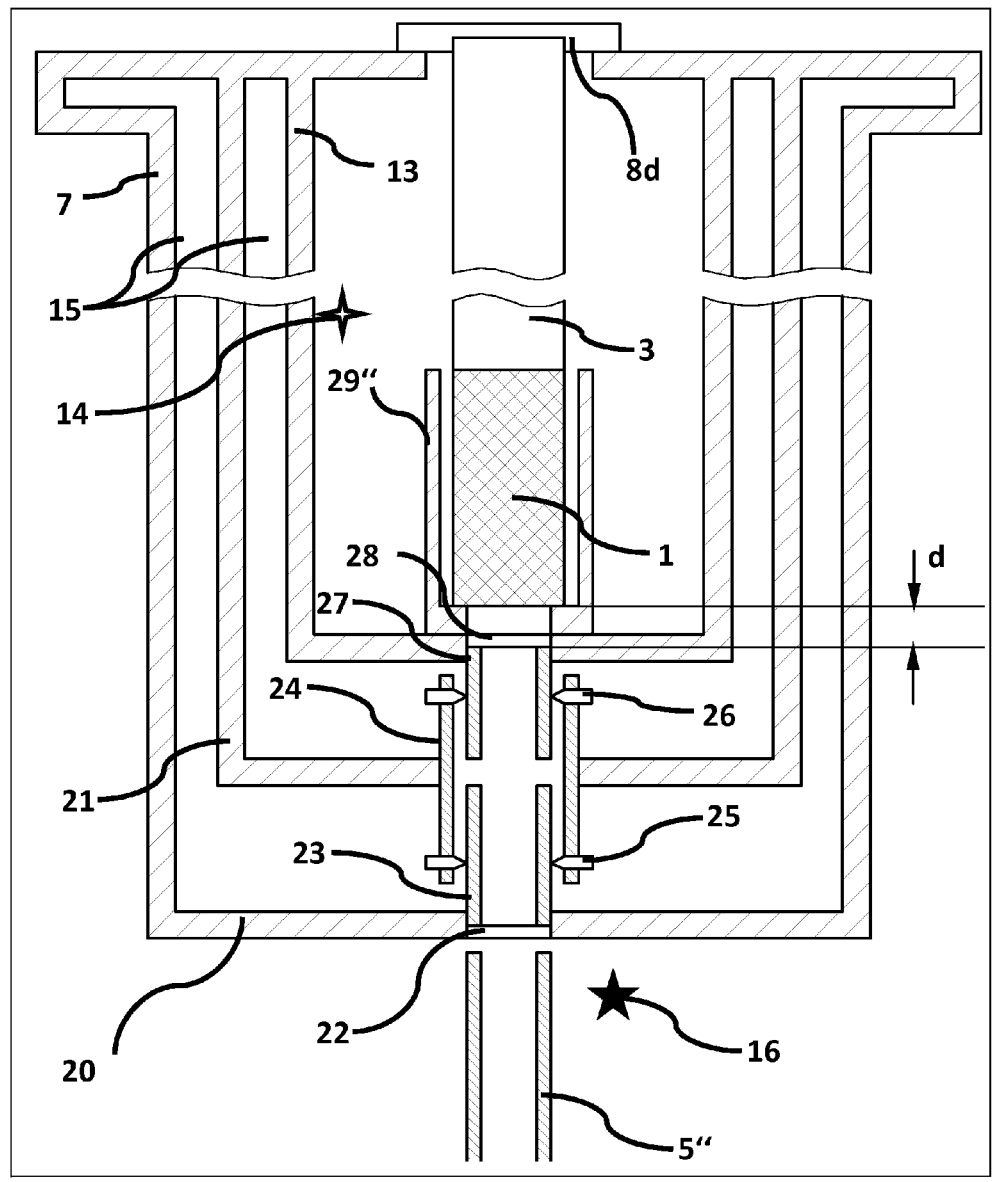
FIG. 6 shows an embodiment of the sample cryostat with inventive microwave guidance and feed-throughs passing through the cryostat.

FIG. 6 illustrates the inventive feed-through of the wave guide passing through the cryostat. In this case, the microwave is guided by the wave guide 5'' in the outer area 16 to the sample 1 which is located in the sample receptacle 29''. All illustrated wave guides which are described below may also be dimensioned "overmoded". This means that wave guides may also be used that have cross-sections which are substantially larger than that of a standard wave guide of corresponding frequency. This results in additional design freedom due to the possibility of using larger wave guides. The energy is then transported in different propagation modes.

In order to prevent a thermal short-circuit between the sample cryostat inner tube 13, the thermal radiation shield 21 and the sample cryostat outer tube 20 during passage through the cryostat, the wave guide is interrupted. The first 23 and the third wave guide piece 27 are generated by this interruption. Both wave guides have an identical cross-section. The interruption between the two wave guides is short. In order to reduce the radiation loss around this gap and increase the efficiency, the second wave guide piece 24 is arranged around the interruption. The second wave guide piece surrounds the first and the third wave guide pieces and accordingly has a larger cross-section. The spacers 25 and 26 ensure mechanical stability of the small separation among the three wave guide pieces. The spacers consist e.g. of nylon, polytetrafluoroethylene (PTFE) or of glass fiber reinforced carbon fibers.

The microwave feed-throughs 22 and 28 ensure vacuum tightness of the cryostat and also microwave permeability. There is also a small gap between the wave guide 5'' in the outer area and the microwave feed-through 22 in order to prevent thermal contact.

Figure 7:
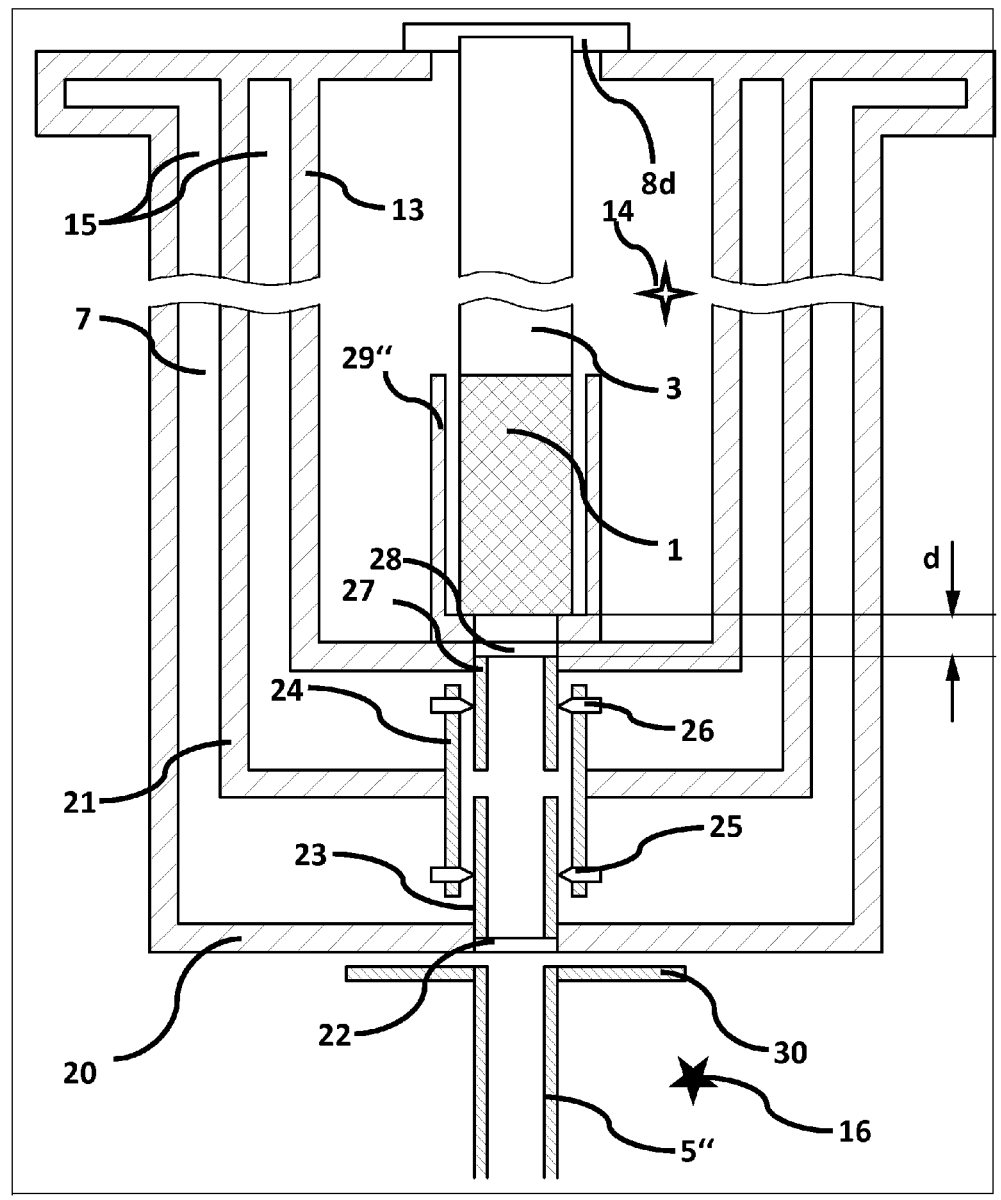
FIG. 7 shows an embodiment of the sample cryostat as in FIG. 6, however, with a flange on the wave guide.

FIG. 7 shows the additional flange 30 in comparison with FIG. 6. The flange reduces microwave radiation loss at the gap. This reduces the propagation losses in the wave guide and additionally increases efficiency.

Figure 8:
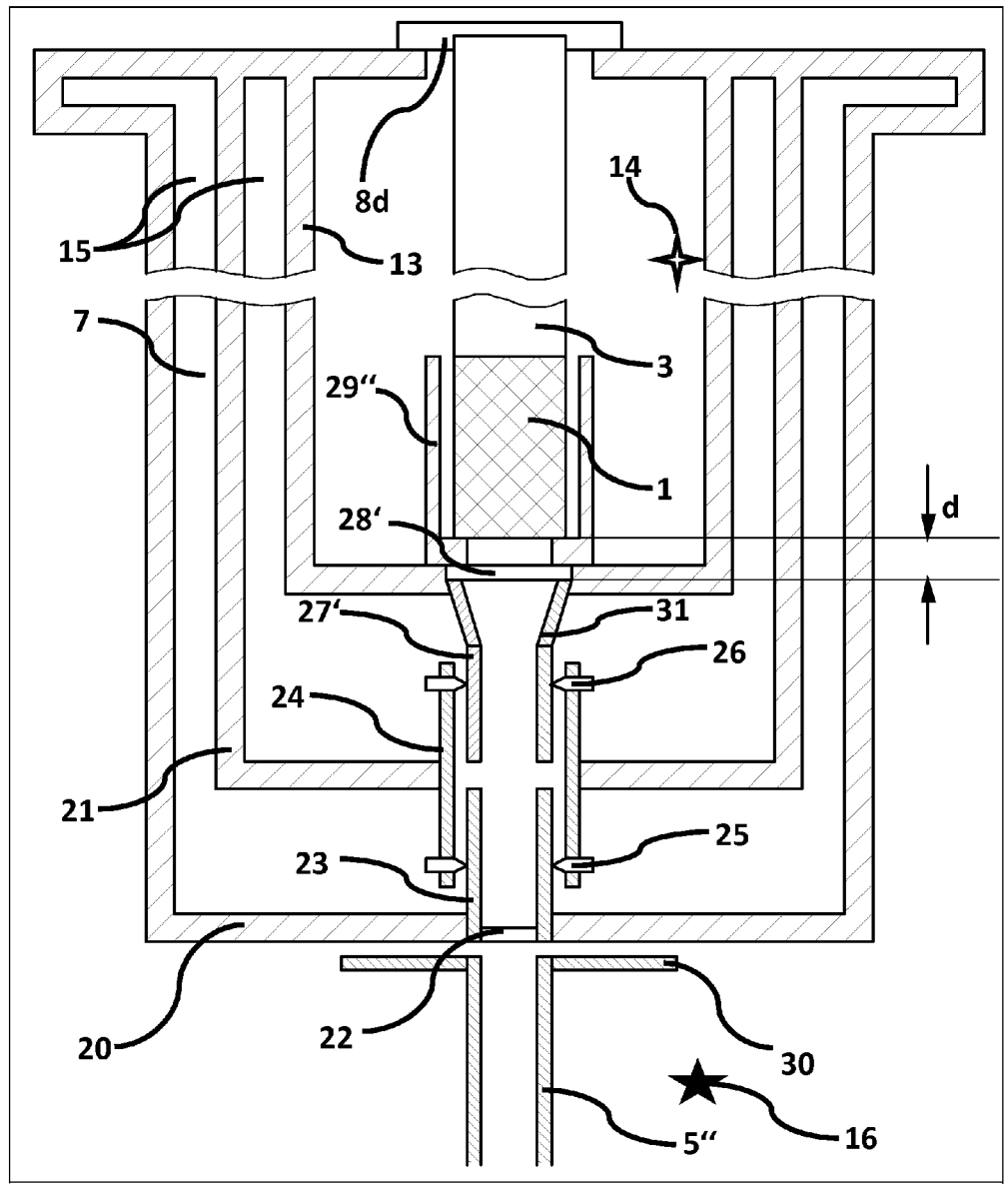
FIG. 8 shows an embodiment of the sample cryostat with inventive microwave guidance and feed-throughs passing through the cryostat with a horn-shaped antenna.

FIG. 8 shows the additional horn-shaped antenna 31 which widens the cross-section of the third wave guide piece 27'. The widening has two substantial advantages. It improves matching to the sample which reduces reflection losses and therefore further increases efficiency. This configuration also enables adjustment of the irradiated cross-section, thereby improving the field homogeneity of the microwave in the sample.

Figure 9:
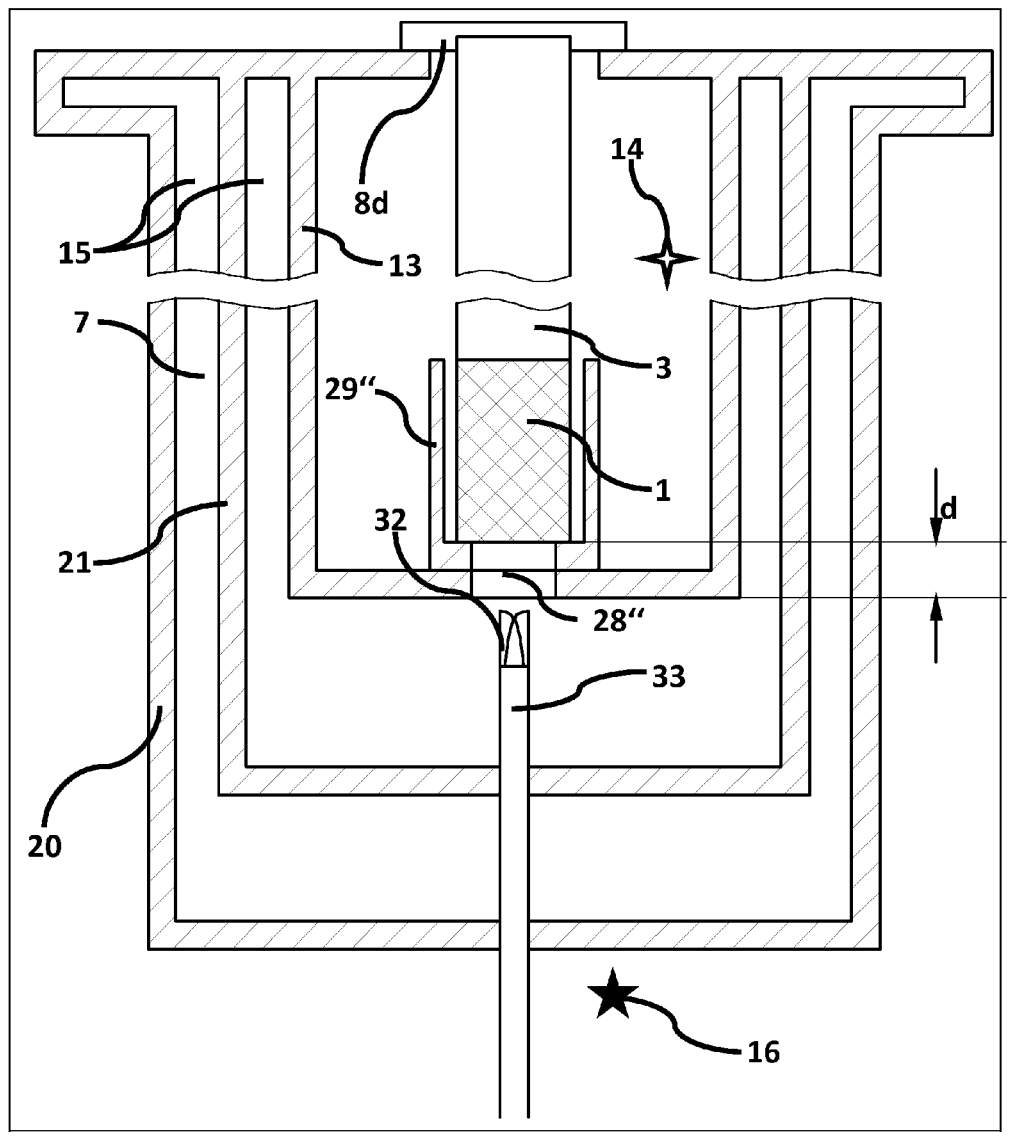
FIG. 9 shows an embodiment of the sample cryostat with inventive microwave guidance realized by a dielectric wave guide.

FIG. 9 shows the inventive configuration which utilizes a dielectric wave guide 33 for guiding the microwaves. The dielectric wave guide consists of an electric insulator with as little dielectric losses as possible, which enables transport of the microwave energy with little loss. The thermal conductivity of the material is also low, for which reason the dielectric wave guide can be guided from the outer area 16 through the sample cryostat outer tube 20 and the thermal radiation shield 21. The antenna 32 is located at the end of the dielectric wave guide and ensures a maximally homogeneous field in the sample.

The antenna may be designed as a simple antenna and also as an antenna array. If the antenna is located between the thermal radiation shield 21 and the sample cryostat inner tube 13, microwave passage 28" in the sample cryostat inner tube is required. The antenna may alternatively also be disposed inside the sample cryostat inner tube. In this case, the dielectric wave guide is guided through the sample cryostat inner tube 13. The microwave feed-through 28" is omitted in this case.

Figure 10:
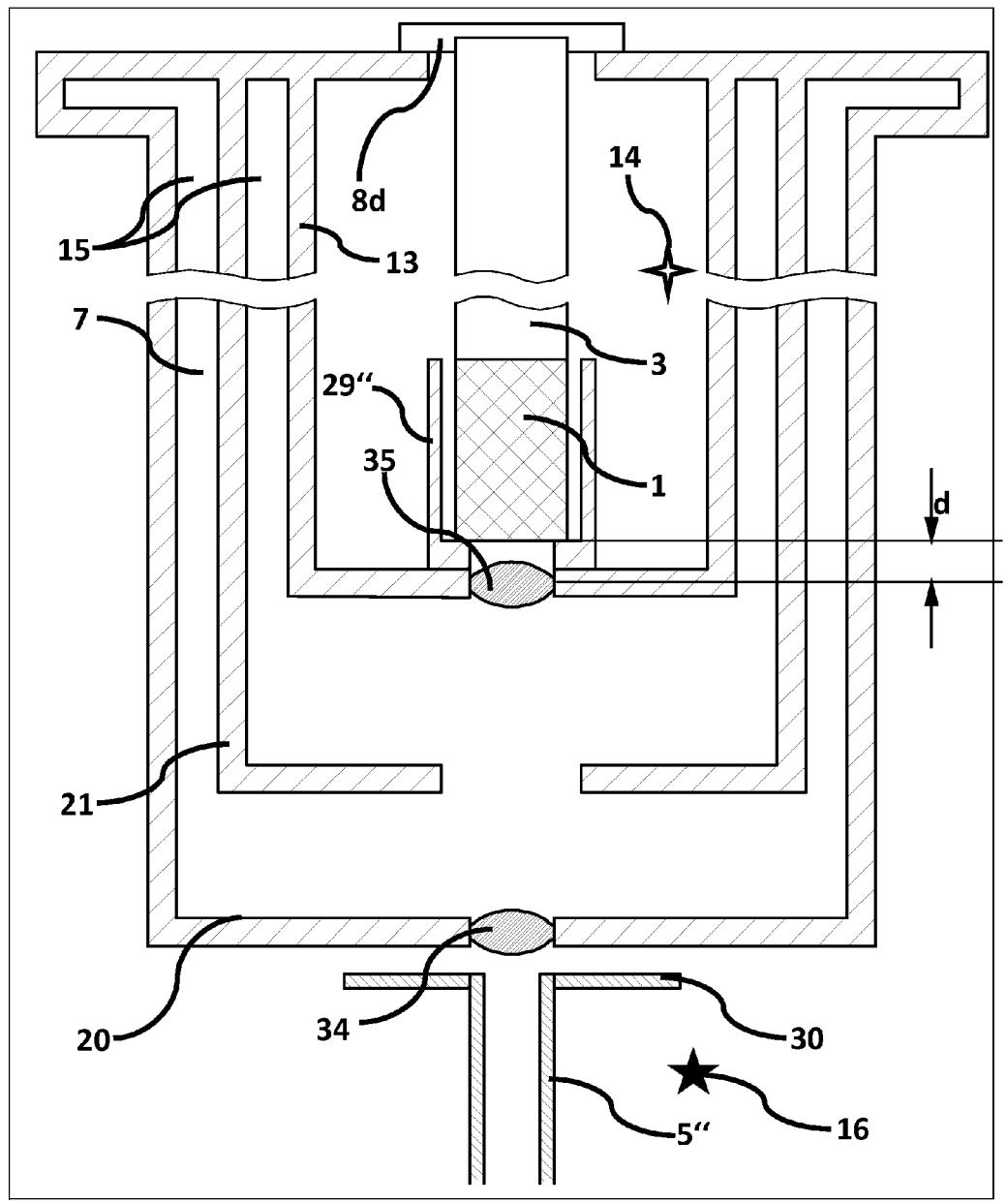
FIG. 10 shows an embodiment of the sample cryostat with inventive microwave guidance realized by two dielectric lenses.

FIG. 10 shows the inventive configuration, in which the microwave is focused by two dielectric lenses 34 and 35. The microwave is guided in the outer area 16 through the wave guide 5 to the first dielectric lens 34. The gap between the sample cryostat outer tube 20 and the wave guide 5" can be varied for optimizing the adjustment and radiation properties. The lenses shown here are spatially arranged in such a fashion that they are simultaneously used as feed-throughs passing through the sample cryostat outer tube 20 (first dielectric lens 34) and sample cryostat inner tube 13 (second dielectric lens 35). In this case, the lenses also achieve vacuum tightness. If the lenses are not arranged in the area of the sample cryostat outer tube and sample cryostat inner tube, or if a different lens configuration is used, an additional microwave feed-through (shown with reference numerals 22 and 28 in FIG. 6) is required.

Figure 11:
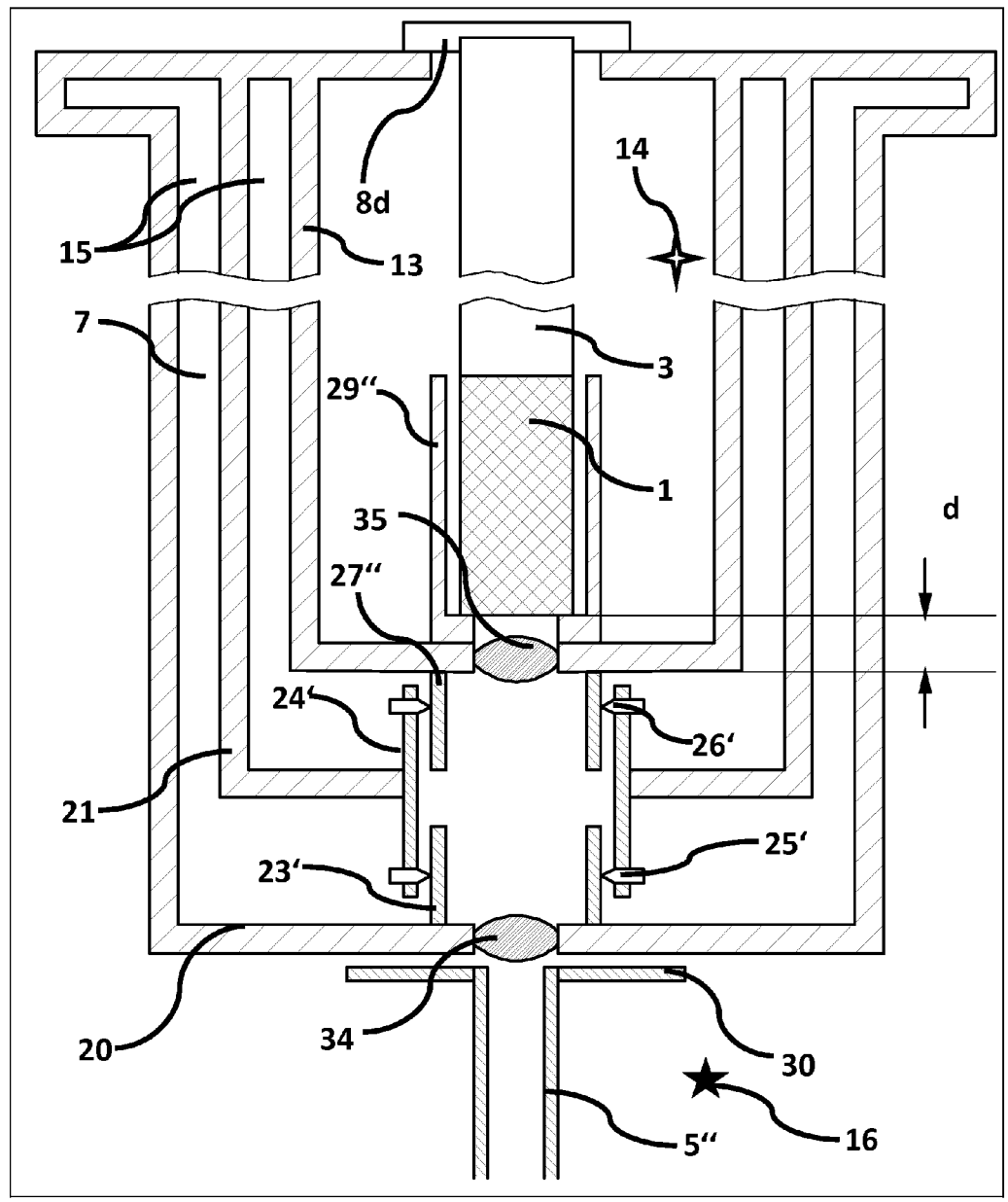
FIG. 11 shows an embodiment of the sample cryostat with inventive microwave guidance realized by two dielectric lenses and wave guides in the cryostat.

FIG. 11 shows an enlargement of the configuration of FIG. 10. The area in which the microwave energy is guided is additionally shielded by a wave guide. The wave guide is subdivided into a first 23', a second 24', and a third wave guide piece 27" in order to ensure thermal insulation (like in FIG. 6). As in FIG. 10, the microwaves are focused by the lenses 34 and 35. Shielding improves the efficiency of the microwave guidance and reduces the heat input into the cryostat caused by the microwave energy.

Figure 12:
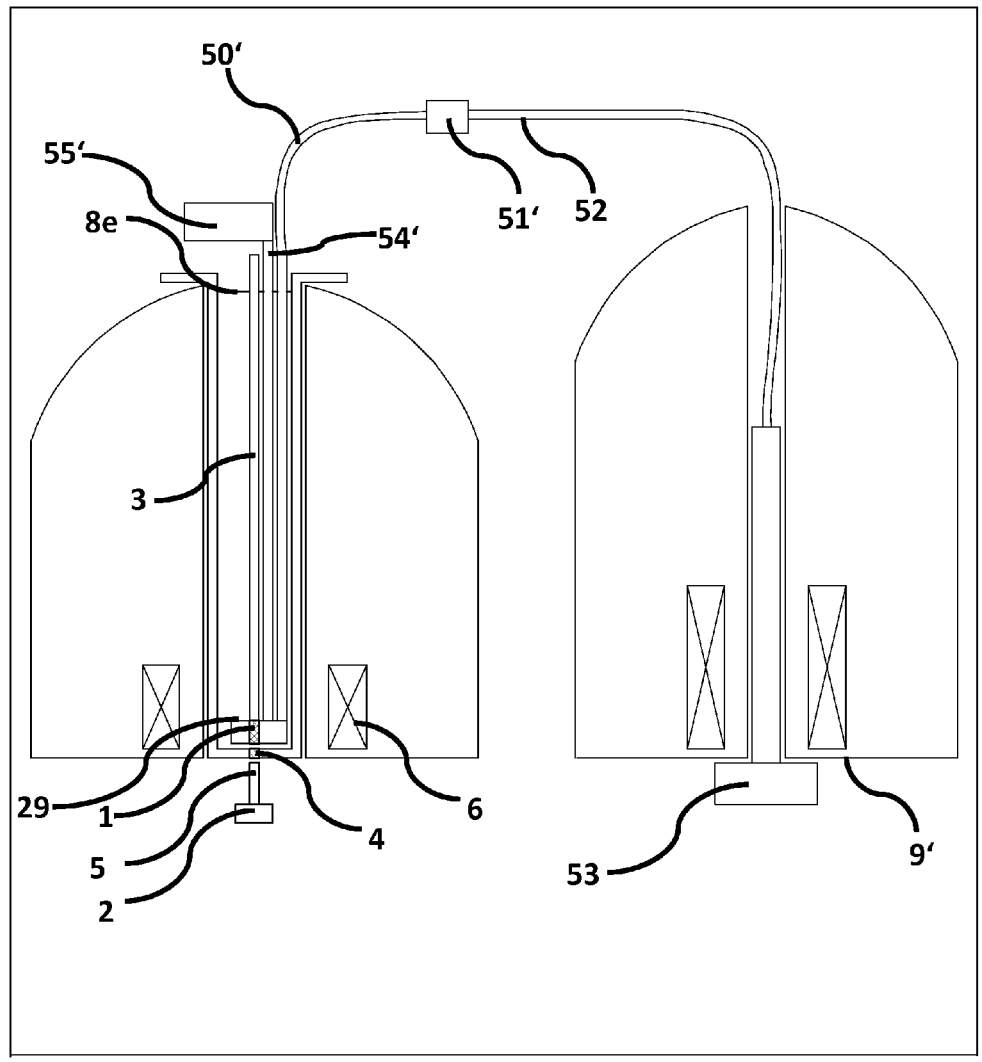
FIG. 12 shows an embodiment of the inventive DNP configuration with microwave that is inserted from below, dissolution device and a second NMR measuring system.

By way of example, FIG. 12 shows the inventive configuration for performing the dissolution DNP process for high-resolution NMR measurements. The sample 1 is thereby irradiated with microwaves in the sample receptacle 29. The microwaves are generated in the microwave source 2 and are introduced through the wave guide 5 and the microwave feed-through 4 into the sample receptacle 29. When the sample has reached an adequate level of polarization due to microwave irradiation, the dissolution liquid from the solvent container 55' is introduced into the sample receptacle via the solvent supply line 54'. The dissolution liquid then dissolves the sample and the sample liquid flows via the outlet line 50' through the dissolution control 51' and the sample line 52 into the NMR probe head 53. The NMR probe head is located in the second cryomagnet 9" in which NMR measurements can then be performed with a considerably increased SNR.

Figure 13:
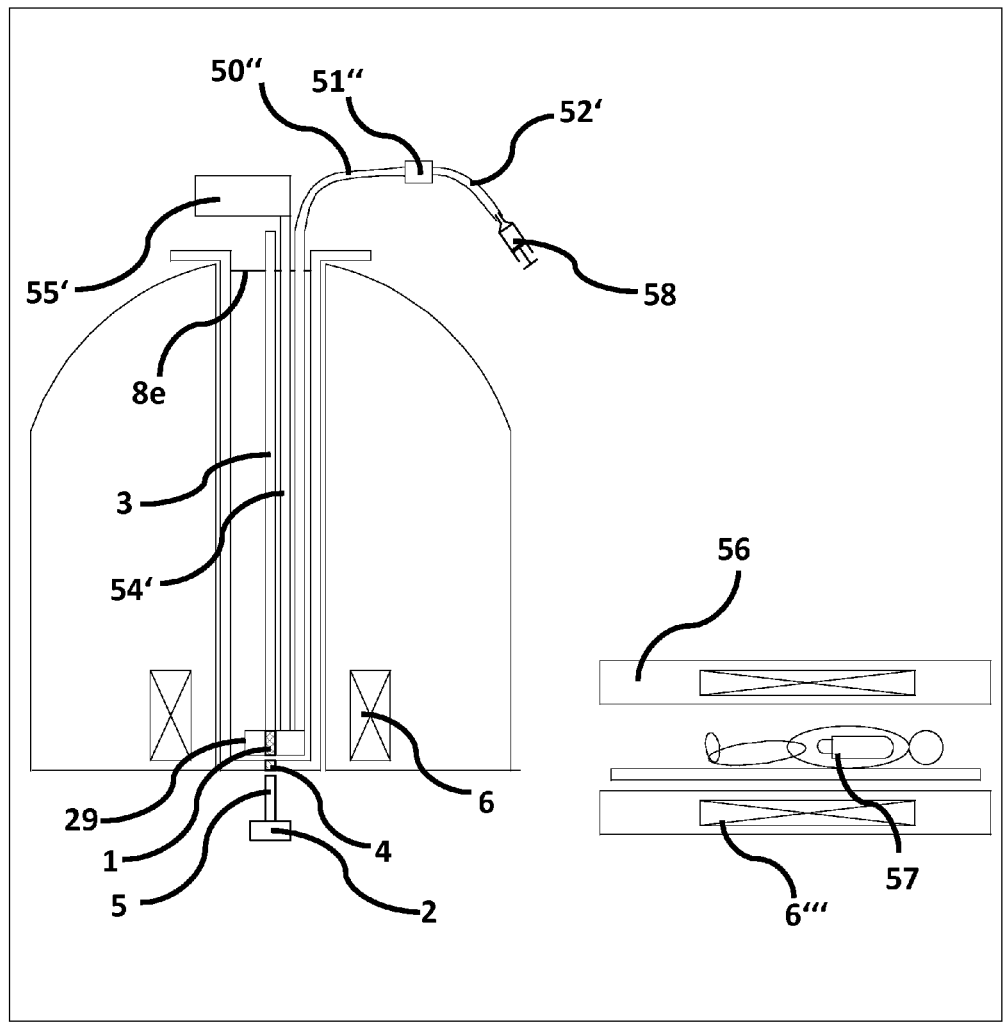
FIG. 13 shows an embodiment of the inventive DNP configuration with microwave that is inserted from below, dissolution device and MRI system.

By way of example, FIG. 13 shows the inventive configuration for performing the dissolution DNP process for magnetic resonance imaging (MRI) measurements. As in FIG. 12, the microwaves are introduced from below through the microwave passage 4 into the sample receptacle 29. As in FIG. 12, the sample is irradiated and dissolved after a certain time. The sample liquid then flows through the outlet line 50" as well as the dissolution control 51" and is subsequently collected by the syringe 58. The sample liquid is then injected into the patient 57 located in the MRI system 56 and MRI images are subsequently generated. The increased polarization decreases very quickly with time after dissolving the sample. For this reason, the processes up to injection of the sample liquid into the patient are very critical with respect to time.

LIST OF REFERENCE NUMERALS (1) sample
(2) microwave source
(3) sample holder
(4,4',4") microwave feed-through
(5,5',5") wave guide
(6,6',6",6'") magnet coil
(7) sample cryostat
(8,8a-e) opening of the sample cryostat
(9,9',9") cryomagnet
(10) wave guide in the cryostat
(11) microwave chamber
(12) magnet cryostat
(13) sample cryostat inner tube
(14) low temperature room
(15) sample cryostat vacuum chamber
(16) outer area
(17) cryostat
(20) sample cryostat outer tube
(21) thermal radiation shield
(22) microwave feed-through from the outer area to the sample cryostat vacuum chamber (15)
(23,23') first wave guide piece in the sample cryostat
(24,24') second wave guide piece in the sample cryostat
(25,25') spacer
(26,26') spacer
(27,27',27") third wave guide piece in the sample cryostat
(28,28',28") microwave feed-through from the sample cryostat vacuum chamber to the low temperature room
(29,29',29") sample receptacle
(30) flange
(31) horn-shaped antenna
(32) antenna including antenna network
(33) dielectric wave guide
(34) first dielectric lens
(35) second dielectric lens
(50,50',50") outlet line
(51,51',51") dissolution control
(52,52') sample line
(53) NMR probe head
(54, 54') solvent supply line
(55,55') solvent container
(56) magnetic resonance imaging system
(57) person to be investigated
(58) syringe
d separation between the sample and the configuration for guiding and irradiating microwaves

REFERENCE LIST

[1] Ardenkjr-Larsen, J. H. et al.: WO 02/37132 A1.
[2] Ardenkjr-Larsen, J. H. et al: "Increase in signal-to-noise ratio of >10,000 times in liquid-state NMR", PNAS, Vol. 100, 10158-10163 (2003)
[3] Comment, A. et al.: "Design and Performance of a DNP Prepolarizer Coupled to a Rodent MRI Scanner", Concepts in Magnetic Resonance Part B, Vol. 31B(4) 255-269 (2007)

[4] Batel, M. et al.: "A mufti-sample 94 GHz dissolution dynamic-nuclear-polarization system", Journal of Magnetic Resonance, Vol. 214, 166-174 (2012)
[5] Gregory, W. D. et al.: DE 1 949 160 A1
[6] Urban, J. et al.: WO 08/121458 A1
[7] Leggett, J. et al.: "A dedicated spectrometer for dissolution DNP NMR spectroscopy", Phys. Chem. Chem Phys., Vol. 12, 5883-5892 (2010)
[8] Dempsey, J. et al.: WO 2011/106524 A1
[9] Saitoh, K. et al.: EP 1 643 261 A1

We claim:

1. A DNP (dynamic nuclear polarization) apparatus for performing a measurement on a sample, the apparatus comprising:
    at least one cryostat having an opening and a loading path for loading the cryostat with the sample, wherein said loading path extends from said opening to a sample receptacle at a location of the sample in said cryostat;
    a magnet coil disposed in said cryostat for generating a homogeneous magnetic field at said location of the sample during the measurement;
    a microwave source for generating microwave radiation; and
    a configuration for supplying said microwave radiation from said microwave source to the location of the sample, said configuration being disposed in said cryostat and comprising a microwave path extending directly to said location of the sample in said cryostat, wherein said microwave path extends spatially separately from said loading path, said configuration for supplying microwave radiation further comprising at least one microwave feed-through passing through one or more walls of said cryostat, wherein said microwave path is incident on said location of the sample from a direction opposite to said loading path or from a sideward location at right angles to or at an inclination with respect to an axis of said loading path.

2. The DNP apparatus of claim 1, wherein said microwave feed-through causes attenuation of said microwave radiation of less than 6 dB, less than 2 dB or less than 0.5 dB.

3. The DNP apparatus of claim 1, wherein material in an area of said feed-through passing through said cryostat walls comprises polytetrafluoroethylene (PTFE), sapphire, aluminum oxide and/or quartz.

4. The DNP apparatus of claim 1, wherein a heat output by said microwave feed-through on said cryostat is less than 200 mW, less than 100 mW or less than 50 mW.

5. The DNP apparatus of claim 1, wherein said microwave feed-through comprises at least one dielectric lens.

6. The DNP apparatus of claim 5, wherein said dielectric lens has an insertion loss of 5 dB, of 2 dB, of 1 dB or of 0.5 dB.

7. The DNP apparatus of claim 5, wherein said the dielectric lens is formed from a dielectric, from a dielectric having a dielectricity constant $\in$ with $1 \leq \in \leq 15$, from polytetrafluoroethylene (PTFE), from sapphire, from aluminum oxide and/or from quartz.

8. The DNP apparatus of claim 1, wherein said configuration for supplying microwave radiation terminates at a separation d from the sample at the sample location in the cryostat of less than 10 mm, less than 5 mm or less than 1 mm.

9. The DNP apparatus of claim 1, wherein said configuration for supplying microwave radiation comprises a dielectric wave guide.

10. The DNP apparatus of claim 9, wherein said dielectric wave guide is formed from a dielectric having a dielectricity constant $\in$ with $1 \leq \in \leq 15$, of polytetrafluoroethylene (PTFE), of sapphire, of aluminum oxide and/or of quartz.

11. The DNP apparatus of claim 1, wherein said configuration for supplying microwave radiation comprises at least one antenna, a horn-shaped antenna, an antenna array, a coupler and/or a power splitter.

12. The DNP apparatus of claim 1, further comprising a configuration for supplying a solvent liquid which enables dissolving of the sample and generation of a hyperpolarized sample liquid.

13. The DNP apparatus of claim 12, wherein the solvent liquid is supplied to the sample from a top location and microwave radiation is supplied to the sample from below.

14. The DNP apparatus of claim 12, wherein the solvent liquid is supplied to the sample from a bottom location and microwave radiation is supplied to the sample from above.

15. Use of the DNP apparatus of claim 12, for generating hyperpolarized liquid for NMR and/or MRI measurements.

* * * * *